(12) United States Patent
Cui

(10) Patent No.: US 6,274,650 B1
(45) Date of Patent: Aug. 14, 2001

(54) EPOXY RESIN COMPOSITIONS FOR LIQUID ENCAPSULATION

(75) Inventor: Cheng Qiang Cui, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/397,531

(22) Filed: Sep. 16, 1999

(30) Foreign Application Priority Data

May 7, 1999 (SG) ................................... 9902085

(51) Int. Cl.[7] ............................... C08K 3/08; C08L 63/02
(52) U.S. Cl. ............................. 523/457; 523/458
(58) Field of Search ................... 523/458, 457

(56) References Cited

U.S. PATENT DOCUMENTS

| | | | |
|---|---|---|---|
| 4,358,552 | * 11/1982 | Shinohara et al. | 523/443 |
| 5,189,080 | 2/1993 | Heyke . | |
| 5,248,710 | 9/1993 | Shiobara et al. . | |
| 5,354,939 | 10/1994 | Hollstein et al. . | |
| 5,416,138 | 5/1995 | Mogi et al. . | |
| 5,439,977 | 8/1995 | Yokota et al. . | |
| 5,457,165 | 10/1995 | Hermansen et al. . | |
| 5,561,174 | 10/1996 | Saito et al. . | |

* cited by examiner

Primary Examiner—Robert Dawson
Assistant Examiner—D. Aylward
(74) Attorney, Agent, or Firm—Oppenheimer Wolff Donnelly LLP

(57) ABSTRACT

Disclosed are liquid epoxy encapsulants comprising a basic bisphenol-type epoxy resin with epoxy groups at each end having an epoxy equivalent of 170–300, and an amine curing agent such as 4,4'-Methylene dianiline with the content of 15–30 wt % with respect to epoxy resins and other additives such as coloring agents, flame retardants, and catalysts. Alphatic and cycloaliphatic epoxy resins and polyamide curing agents can optionally be added to mix with the bisphenol epoxy resin to modify the properties of the liquid epoxy encapsulants, i.e., to decrease their viscosities and to increase their toughness. The liquid epoxy encapsulants of this invention have characteristics of suitable viscosity, fast curing, high adhesion to polyimides and high reliability in the application of flip-chip-on-board (FCOB) encapsulation as underfill materials. These liquid epoxy resins are also able to be applied in epoxy die attach adhesives and epoxy electrically conductive adhesives in the form of isotropic (ICA) and anisotropic conductive adhesives (ACA), with their excellent properties of fast curing and high adhesion.

23 Claims, 1 Drawing Sheet

EPOXY RESIN COMPOSITIONS FOR LIQUID ENCAPSULATION

DESCRIPTION

1. Technical Field

The present invention is related to liquid encapsulants for electronics components, more specifically those based upon liquid epoxy resins.

2. Background Art

Polymer encapsulants, mostly epoxy encapsulants, are commonly used in IC packaging for thermal and moisture resistance. In recent years with higher integration of integrated circuits, IC chips have become smaller with larger chips. This produces problems such as packaging delamination and cracks caused by stress and moisture. For example, the solder joints in flip chip on board are easily broken caused by stress, causing the flip chip to fail, if underfill encapsulant materials are not used in the package. With underfilling by epoxy encapsulants, the reliability of flip chip on board devices will be significantly increased. Therefore, good performance of encapsulants in stress and moisture resistant is very important for the reliability of packages.

Liquid epoxy composite materials having inorganic fillers blended in liquid epoxy resins are often used as encapsulants for underfilling in flip chip and chip-size packages, and glob-top dispensing/stencil bringing in chip-on-board (COB) and ball grid aray (BGA) packages. Such epoxy encapsulants are commercially available in one-component or two-component products. The one-component products consist of a uniform premix of a base epoxy resin, a curing agent, and other additives which is a mainstay in the art because it is easier to use.

Currently some epoxy encapsulants incorporating acid anhydrides have several drawbacks. The encapsulant materials tend to absorb moisture which causes the materials to expand in volume and results in the degraded performance of the packages. Some epoxy resins, such as epichlorohydrin and bisphenols or other novolak resins, and cycloaliphatic epoxy resins, epoxy resins having incorporated therein hologen atoms like chlorine and brominc atoms, are commonly used for liquid encapsulants because they are liquid at room temperature. An imidazole curing agent was proposed to be used for the base epoxy resins.

U.S. Pat. No. 5,561,174 discloses liquid epoxy resin compositions comprising (A) a liquid epoxy resin, (B) a dimethylpolysiloxane having epoxy groups at both ends and (C) a dispersing agent comprising the reaction product of (C-1) a dimethylpolysiloxane having amino groups or carboxyl groups reactive with epoxy resins on its side chains or both ends and having phenyl groups or polyether groups for improving compatibility with epoxy resins on its side chains, and (C-2) an epoxy resin having the same structure as component (A).

U.S. Pat. No. 5,189,080 discloses an encapsulating resin for electronics components consisting of cycloaliphatic epoxy resin, a hardener, an accelerator, a filler, and optionally, a pigment. The hardener can be methylnadic anhydride and the filler can be amorphous silica.

U.S. Pat. No. 5,248,710 discloses flip chip encapsulating compositions comprising (A) an epoxy resin having at least two epoxy groups per molecule, (B) a silicone-modified epoxy resin, (C) an imidazole curing agent soluble in epoxy resin (A) and (D) fused silica filler.

U.S. Pat. No. 5,354,939 discloses stabilized epoxy resin compositions comprising (a) liquid epoxy resin, (b) filler comprising quartz flour, (c) a polyether polyol and (d) an organically modified sheet silicate.

U.S. Pat. No. 5,416,138 discloses epoxy resin compositions for sealing semiconductor devices, "comprising as essential components" (A) an epoxy resin containing 50–100 weight percent of a diglycidyl ether of a substituted bisphenol identified as formula (I), (B) a phenolic resin curing agent containing 30–100 weight percent of a specific phenolic resin curing agent identified by formula (II), (C) an inorganic filler and (D) a curing accelerator.

U.S. Pat. No. 5,439,977 discloses an acid anydride-containing one package epoxy resin composition "consisting indispensably of" (1) an epoxy resin having two or more epoxy groups per molecule, (2) an acid anhydride, (3) at least one of (a) a liquid latent curing accelerator, (b) a latent curing accelerator soluble in epoxy resins such as (1) and (c) a latent curing accelerator soluble in acid anhydride and (4) a dispersible latent curing accelerator.

U.S. Pat. No. 5,457,165 discloses an encapsulant of amine-cured epoxy resin blends comprising (a) a first liquid epoxy resin comprising either: (1) the diglycidyl ether of polyoxypropylene glycol; or (2) the diglycidyl ester of linoleic dimer acid; (b) a second liquid epoxy resin comprising the diglycidyl ether of 1,4-butanediol, present as 12–55 parts by weight; and (C) a stoichiometric amount of an epoxy resin curing agent selected from flexibilized polyamines or polyamides.

DISCLOSURE OF THE INVENTION

An objective of the present invention is to provide one-component liquid encapsulant materials for underfilling, stencil printing, and dispensing for package such as flip chip, CSP, and BGA, etc. The liquid encapsulant materials provided in this invention have a high glass-transition temperature (Tg), high adhesion, and good moisture and stress resistance. The preferred basic epoxy resin in the liquid encapsulants developed in this invention is poly(bisphenol A-co-epichlorohydrin) glycidyl end-capped with epoxy groups at its ends at an epoxy equivalent of 189.

In accordance with the present invention, a liquid encapsulating composition is provided which comprises a poly(bisphenol A-co-epichlorohydrin) glycidyl end-capped with epoxy groups at each end of the molecule. This family of epoxy resins is characterized by formula I below. Optionally, one or two aliphatic or cycloaliphatic diepoxy resins can be added to modify the properties of the liquid encapsulating composition. The compositions further comprise as a curing agent a diamine compound having amine groups at each end of the molecule. The diamine compound can be an aromatic, aliphatic or cycloaliphatic compound. The compositions also optionally comprise an inorganic oxide filler. The filler, when used, is soaked with a surfactant for surface treatment to enhance its adhesion to the epoxy resin. The surfactant is preferably a silane.

BEST MODES FOR CARRYING OUT THE INVENTION

Figure 1:
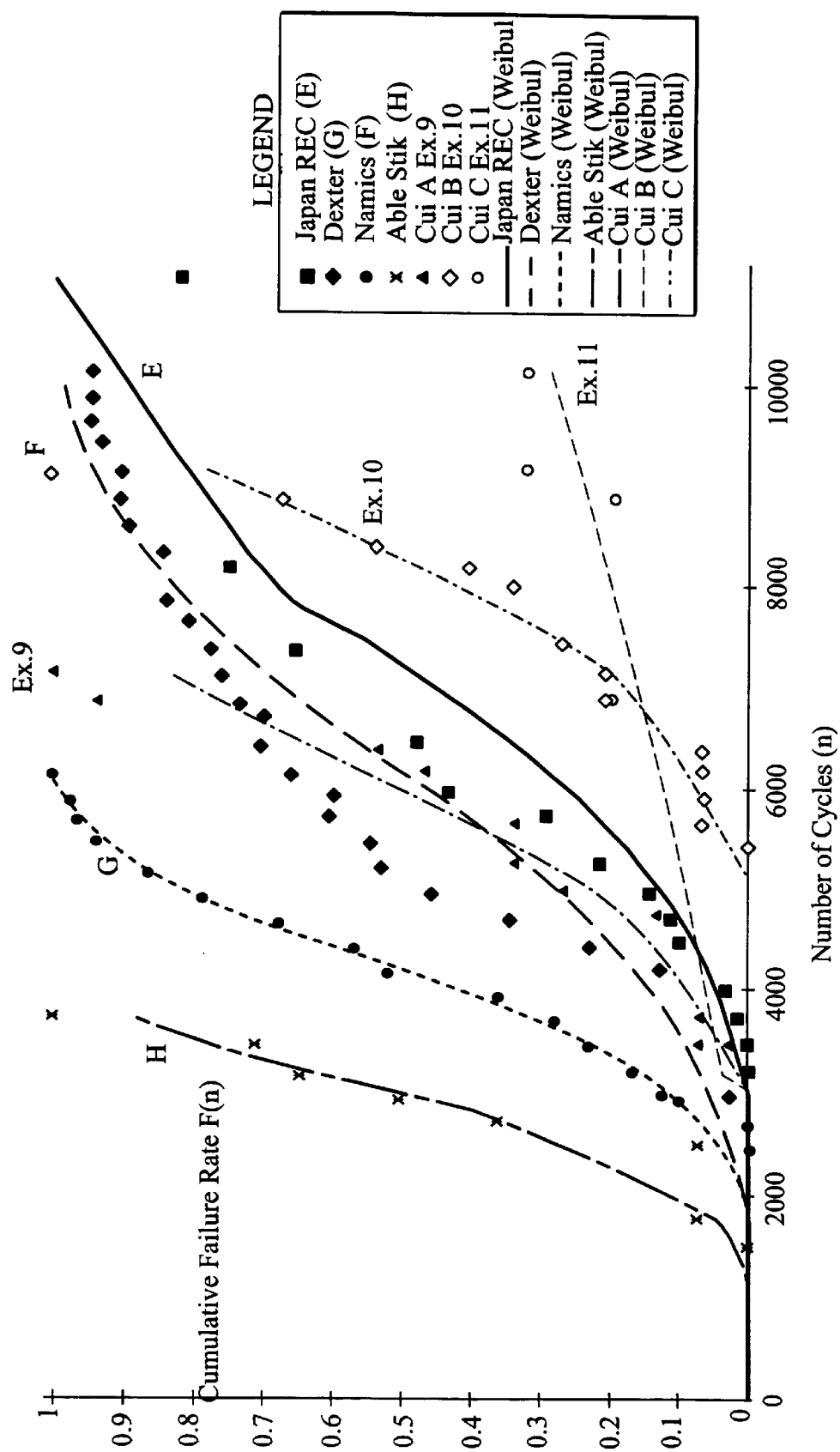
FIG. 1 (the sole FIGURE) is a graph of thermal cycling reliability test data for chips containing underfill compositions of the invention vs. commercial underfill products.

The liquid encapsulants of this invention include three main components of (A) epoxy resin, (B) curing agent, and (C) filler.

Component (A): epoxy resin

The base epoxy resin is a bisphenol-type epoxy resin with epoxy groups on both ends of the molecular chain. Its structure is shown as below in Formula I:

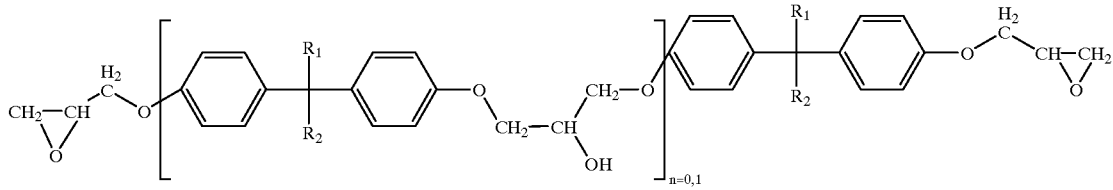

where n=0 or 1 and $R_1$ and $R_2$ are substituted or unsubstituted monovalent hydrocarbon groups or alkoxy groups. This basic bispenol-type epoxy resin has an epoxy equivalent of 170–300. $R_1$ and $R_2$ can be the same or different with 1 to about 3 carbon atoms. Substituents can include halo and lower alkyl such as methyl and ethyl.

If desired, one or two monoepoxy compounds may be used in combination with the basic bisphenol-type epoxy resin to modify the properties of the liquid encapsulants, i.e., to decrease their viscosities and to increase their thoughness. For example, the below aliphatic and cycloaliphatic epoxy resins can be used in the admixture of epoxy resins of the liquid encapsulants.

Bis(3,4-epoxycyclohexyl)sdipate which can be obtained from ERL-4299 of Union Carbide Corp., USA:

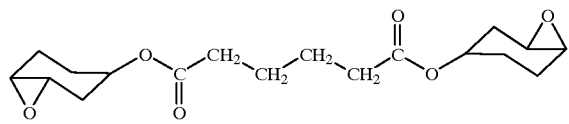

3,4-Epoxycyclohexylmenthyl-3,4—epoxylcyclohexane carboxylate which can be obtained from ERL-4221 of Union Carbide Corp., USA:

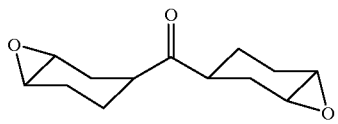

Bis(2,3-epoxycyclopentyl)ether which can be obtained from ERLA-0400 of Union Carbide Corp., USA:

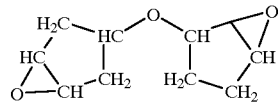

Diglycidyl ether of polyoxypropylene glycol which can be obtained from DER 732 and DER 736 of Dow Chemical Co., USA:

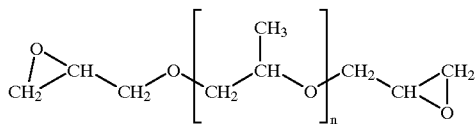

Diglycidyl ether of 1,4-butanediol which can be obtained from Heloxy WC-67 of Wilmington Chemical, USA:

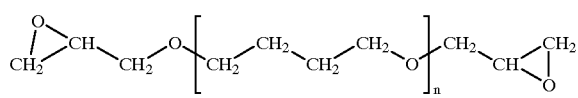

Component (B): curing agent

The curing agent used in this invention is an amine-type compound such as 4,4'-Methylene dianiline which has amine groups on the ends of the molecule, schematically shown as below:

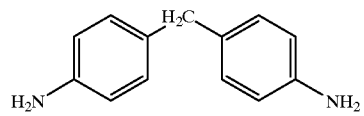

Aliphatic and cycloaliphatic polyamines as below can also be used as curing agents to modify the properties of the liquid encapsulants if desired:

N-Aminoethyl piperazine which can be obtained from Texaco Chemical Co.

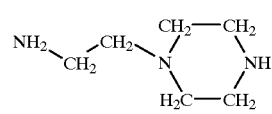

Menthenediamine which can be obtained from Rohm & Haas Co.

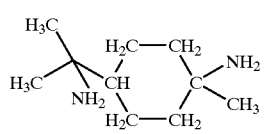

Component (C) filler

The filler in the liquid encapsulants can be an inorganic oxide powder such as fused silica powder, alumina and titanium oxides, and nitrates of aluminum, titanium, silicon, and tungsten. The addition of filler will decrease the flow performance of liquid encapsulants and increase the moisture absorption resistance of the encapsulants. Therefore, whether filler is added in the liquid encapsulants is dependent on particular case or desire.

Prior to the addition of filler to the liquid encapsulants, the fillers are soaked with a surfactant for surface treatment of the filler to enhance the adhesion of the filler to the epoxy. The surfactant is usually a silane. The silane preferably used in this invention is gamma-glycidoxypropyl trimethoxysilane, having the structure below:

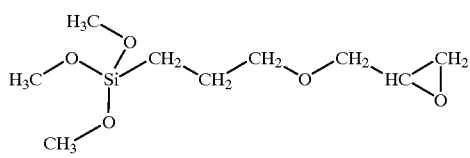

X

The fillers soaked with the silane are heated to over 100° C. to evaporate excess amounts of the silane. After cooling, the fillers can be added to the epoxy compounds.

Other additives, such as carbon black as a coloring agent, imidazole or benzylimidazole as catalysts, and brominated epoxy resin or antimony trioxide as flame retardants, etc. can be added to the liquid encapsulants in contents ranging from 0.1 to 5 wt. %. Catalysts are used in limited quantities, less than 0.5 wt. % of the total composition.

Composition of Liquid Epoxy Encapsulants

For the basic bisphenol epoxy resin or its mixtures, the composition of the epoxy resin compositions is as below:

TABLE 1

| Basic bisphenol epoxy resin | 60 to 100 wt % |
|---|---|
| Aliphatic and Cyeloaliphatic epoxy resin | 0 to 40 wt % |
| Curing agent(s) | 15 to 30 wt %* |
| Filler(s) | 0 to 70 wt %** |

*Based upon total resin = epoxy resin(s) and curing agent(s)
**Based upon total composition = total resin + filler The liquid epoxy resins of this invention can also be used in epoxy die attach adhesives and epoxy electrically conductive adhesives in the forms of isotropic (ICA) and anisotropic conductive adhesives (ACA) with their excellent properties of fast curing and high adhesion.

The invention will be further illustrated by the following non-limiting examples. Examples 1–3

Liquid epoxy encapsulants are formulated as underfill materials for the encapsulation of flip chip on board devices. The compositions and properties of the liquid epoxy encapsulants are listed in Table 2. The basic bisphenol-type epoxy resin used here is poly(bisphenol A-co-epichlorohydrin) glycidyl end capped, with an epoxy equivalent of 189, whose structure is shown below:

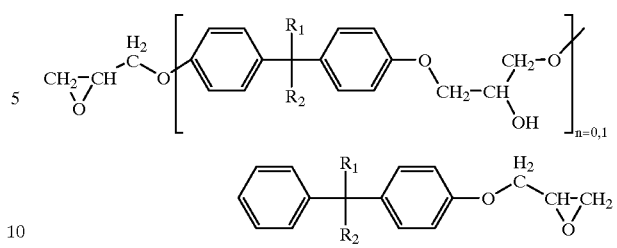

TABLE 2

Composition and properties of some liquid epoxy encapsulants as underfill materials in the application of flip chip on board.

| Liquid Epoxy Encapsulant (Example) | 1 | 2 | 3 |
|---|---|---|---|
| Component | Content wt % | | |
| (A): Poly(bisphenol A-co-epichlorohydrin) glycidyl end capped | 50 | 43.5 | 36.2 |
| (B): A - Methylene dianiline | 20 | 16 | 13.3 |
| (C): Fused silica | 0 | 40 | 50 |
| (D): Carbon black | 0 | 0.5 | 0.5 |
| Properties | | | |
| Curing Conditions | 150° C. 30 min | 150° C. 30 min | 150° C. 30 min |
| Glass transition Temperature (Tg), ° C. -- @DSC | 142.2 | 140.0 | 140.3 |
| Coefficient of Thermal Expansion (CTE), ppm/° C. -- @TMA | 28.0 | 42.9 | 34.0 |
| Degree of Curing % -- @DSC | 72.2 | 91.6 | 97.5 |
| Performance | | | |
| Pre-heating Temperature, ° C. | 80 | 80 | 80 |
| Encapsulation Time, sec | 20 | 30 | 35 |
| Reliability on Thermal Cycling from −40° C. to 125° C. | >3000 | >3000 | >3000 |

Performance examination was done in flip chip on PCB board with a die size of 7 × 15 mm and a joint gap of 160 μm.

These liquid epoxy encapsulants have a high Tg of about 140° C. after curing at 150° C. for 30 min. The coefficient of thermal expansion ("CTE") value of the encapsulants can reach to 28 ppm/° C. or below if the content of the curing agent with respect to epoxy resin is decreased to 20 wt %.

The mixture of aliphatic and cycloaliphatic epoxy resins with the basic bisphenol-type epoxy resin or the use of aliphatic and cycloliphatic polyanine curing agents will modify the flow performance of the liquid epoxy encapsulants, increase their flow rate in underfilling and decrease the encapsulation time of the flip chip.

In order to get faster curing of the encapsulants, catalysts such as imidazole or benzylimidazole for activating the curing agent can be added to the encapsulants. The amount of catalyst in the encapsulants is preferably about 0.1–0.5 wt. % It was found that these catalysts do not take effect at room temperature so as not to affect the pot life of the liquid epoxy encapsulants.

EXAMPLES 4 and A

The adhesion in shear test of the liquid epoxy encapsulant IME-1 as a underfill to polyimide on silicon and solder resist on PCB substrate was measured, in comparison with a commercial underfill, Underfill A. The test vehicle was the silicon chip with a size of 4 mm×4 mm coated with polymide which was attached onto a PCB substrate with underfills. After the underfills were cured at the recommended curing conditions, the shear test was conducted on the test vehicle to measure the adhesion of the underfills to polyimide or solder resist. The adhesion results are shown in Table 3.

TABLE 3

Adhesion in shear test of IME-1 and NF 5t00ZJ underfills to polyimide or solder resist.

| Underfill | Example 1 | (Control) Underfill A |
|---|---|---|
| Average Adhesion Kg | 75.0 | 30.7 |
| Standard Deviation, Kg | 16.37 | 4.25 |
| Failure Mode | Polyimide/underfill & cohesive | Polyimide/underfill |

Sample Size = 3

The above results show that the Example 1 epoxy encapsulant has more than one time higher adhesion to polyimide than commercial Underfill A. Thus, for underfilling encapsulations, the epoxy encapsulants of the invention with higher adhesion to polyimide and solder resist, will support FCOB to provide higher reliability.

EXAMPLES 5–7 and A–D

Reliability tests, in thermal cycling (TC) from −40° C. to 125° C., with a cycle time of 40 min and temperature/humidity (T/H) exposure at 85° C./85%, of flip chip on board with the encapsulation of various underfills have been done. The FCOB has a die size of 7 mm ×15 mm, a joint gap of 160 $\mu$m and 12 solder joints. The reliability results are shown in Table 4.

TABLE 4

Reliability result in thermal cycling and temperature/humidity exposure of the FCOB with the encapsulation of various underfills.

| Reliability | Example 1 | Example 2 | Example 3 | Underfill A | Underfill B | Underfill C | Underfill D |
|---|---|---|---|---|---|---|---|
| TC, cycles (failure) | 3494 | >3746 (0/15) | 3494 (1/16) | 3750 (1/63) | 2961 (2/95) | 2935 (8/94) | 1154 (1/1A) |
| T/H hours (failure) | 1058 (1/15) | 1058 (2/16) | >1226 (0/14) | >1226 (0/14) | >1226 (0/15) | >1226 (0/13) | ? |

As illustrated by these results, the liquid epoxy encapsulants developed in this invention as underfill materials in the encapsulation of flip chip on board can provide outstanding reliability for flip chip packages in thermal cycling and temperature/humidity exposure reliability tests because of their high adhesion.

EXAMPLES 9–11 AND E–H

Reliability Testing of Underfills

Chips at a size of 7 mm×14 mm were assembled on FR4 substrate with a stand-off of 150 um. Before the underfills were dispensed, the flip chip on board (FCOB) was cleaned by solvent to remove flux residue, then dried in an oven at 125° C. for 24 hours. The thermal cycling test in the range of −45° C. to 125° C. was done to assess the performance of the underfills.. three types of invented underfills and four types of commercially available underfills (Controls E–H) were included in the thermal cycling reliability test of FCOB.

Compositions of the invented underfills

| | Example | | |
|---|---|---|---|
| Components | 9 | 10 | 11 |
| Bisphenol-A (wt % of epoxy mix) | 80 | 73 | 73 |
| 4,4'-Methylene dianiline (wt % of epoxy mix) | 20 | 27 | 27 |
| Silica (wt % of total) | 0 | 40 | 50 |

The results of the reliability tests of FCOB are shown in the below Table 5 and FIG. 1. As shown in the results, the invented underfills are among the top performing underfills.

TABLE 5

| *Underfill | No. of Cycles for | |
|---|---|---|
| Example | 5% failures | 10% failures |
| C1 E | 4250 | 4732 |
| C2 F | 3738 | 4209 |
| C3 G | 2450 | 3002 |
| C4 H | 1700 | 2000 |
| IHA 9 | 3494 | 3996 |
| IHB 10 | 5669 | 6400 |
| IHC 11 | 3494 | 6205 |

*C: Commercial; IH: In-house

Although only a few embodiments of the present invention have been described in detail herein, it should be understood that the present invention may be embodied in many other specific forms without departing from the spirit or scope of the invention.

As will further be appreciated, the present invention is suitable for use in a variety of liquid encapsulants for electronics components.

Therefore, the present examples and embodiments are to be considered as illustrative and not restrictive and the invention is not to be limited to the details given herein but may be modified within the scope of the appended claims.

I claim:

1. A liquid encapsulating composition comprising an epoxy resin, the poly(bisphenol A-co-epichlorohydrin) glycidyl end-capped species characterized by the formula:

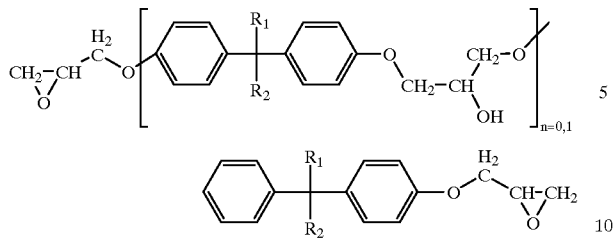

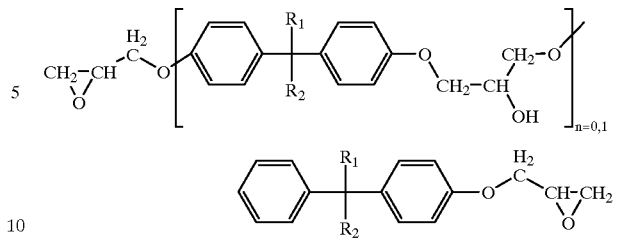

wherein n=0 or 1 and $R_1$ and $R_2$ are substituted or unsubstituted monovalent hydrocarbon groups or alkoxy groups, and wherein $R_1$ and $R_2$ are methyl and n=1 in said epoxy resin, and a curing agent comprising a diamine compound having amine groups at each end of the molecule.

2. The composition of claim 1 wherein said epoxy resin has an epoxy equivalent in the range of from about 170 to about 300.

3. The composition of claim 1 which further comprises one or two additional epoxy resins selected from the group consisting of aliphatic and cycloaliphatic diepoxy compounds.

4. The composition of claim 3 wherein said additional epoxy resins are selected from the group consisting of bis(3,4-epoxycyclohexyl)adipate, 3,4-epoxycyclohexylmethyl-3,4-epoxycyclohexane carboxylate, bis(2,3-epoxycyclopentyl) ether, the diglycidyl ether of polyoxypropylene glycol, the diglycidyl ether of 1,4-butanediol and vinyl cyclohexane diepoxide.

5. The composition of claim 1 wherein said curing agent is selected from the group comprising 4,4'-methylene dianiline, N-aminoethyl piperazine and menthenediamine.

6. The composition of claim 1 which further comprises a filler.

7. The composition of claim 6 wherein said filler is selected from the group consisting of silica, alumina and titania.

8. The composition of claim 8 wherein said filler is soaked in a surfactant before addition to said epoxy resin.

9. The composition of claim 1 wherein said curing agent is present as from about 15 to about 30 weight percent of said epoxy resins.

10. The composition of claim 3 wherein said epoxy resin(s) comprise from about 60 to 100 weight percent of said bisphenol A resin and from 0 to about 40 weight percent of said additional epoxy resin(s).

11. The composition of claim 10 wherein said curing agent is present as from about 15 to about 30 weight percent of said epoxy resins.

12. The composition of claim 6 wherein said filler comprises up to 70 wt. % of the total composition.

13. A liquid encapsulating composition comprising:

an epoxy resin, the poly (bisphenol A-co-epichlorohydrin) glycidyl end-capped species characterized by the formula:

wherein n=0 or 1 and $R_1$ and $R_2$ are substituted or unsubstituted monovalent hydrocarbon groups or alkoxy groups; and a curing agent comprising a diamine compound having amine groups at each end of the molecule, said composition further comprising a filler, wherein said filler is soaked in a surfactant before addition to said epoxy resin.

14. The composition of claim 13 wherein $R_1$ and $R_2$ are methyl and n=1 in said epoxy resin.

15. The composition of claim 14 wherein said filler is selected from the group consisting of silica, alumina and titania.

16. The composition of claim 14 wherein said epoxy resin has an epoxy equivalent in the range about 170 to about 300.

17. The composition of claim 14, further comprising one or two additional epoxy resins selected from the group consisting of aliphatic and cycloaliphatic diepoxy compounds.

18. The composition of claim 17 wherein said additional epoxy resins are selected from the group consisting of bis(3,4-epoxycyclohexyl)adipate, 3,4-epoxycyclohexylmethyl-3,4-epoxycyclohexane carboxylate, bis(2,3-epoxycyclopentyl) ether, the diglycidyl ether of polyoxypropylene glycol, the diglycidyl ether of 1,4-butanediol and vinyl cyclohexane diepoxide.

19. The composition of claim 14 wherein said curing agent is selected from the group comprising 4,4'-methylene dianiline, N-aminoethyl piperazine and menthenediamine.

20. The composition of claim 14 wherein said curing agent is present as from about 15 to about 30 weight percent of said epoxy resins.

21. The composition of claim 17 wherein said epoxy resins comprise about 60 to about 100 weight percent of said bisphenol A resin and from 0 to about 40 weight percent of said additional epoxy resins.

22. The composition of claim 21 wherein said curing agent is present as from about 15 to about 30 weight percent of said epoxy resins.

23. The composition of claim 14 wherein said filler comprises up to 70 wt. % of the total composition.

* * * * *